United States Patent [19]
Takashima et al.

[11] Patent Number: 5,292,396
[45] Date of Patent: Mar. 8, 1994

[54] PLASMA PROCESSING CHAMBER

[75] Inventors: Shigekazu Takashima, Musashino; Norio Sakamoto, Tachikawa, both of Japan

[73] Assignee: M. C. Electronics Co., Ltd., Tokyo, Japan

[21] Appl. No.: 968,750

[22] Filed: Oct. 30, 1992

[30] Foreign Application Priority Data

Nov. 11, 1991 [JP] Japan .................. 3-322502

[51] Int. Cl.$^5$ .......................... H01L 21/00
[52] U.S. Cl. ...................... 156/345; 156/643; 118/723 ER
[58] Field of Search ............ 156/643, 345; 118/723; 204/298.31, 298.33

[56] References Cited

U.S. PATENT DOCUMENTS

| | | | |
|---|---|---|---|
| 3,879,597 | 4/1975 | Bersin et al. | 219/121 |
| 4,062,318 | 12/1977 | Ban et al. | 118/49 |
| 4,550,239 | 10/1985 | Uehara et al. | 219/121 |
| 4,550,242 | 10/1985 | Uehara et al. | 219/121 |
| 5,099,100 | 3/1992 | Bersin et al. | 156/345 KR |

FOREIGN PATENT DOCUMENTS

| | | |
|---|---|---|
| 53-90870 | 8/1978 | Japan . |
| 55-62231 | 12/1980 | Japan . |
| 4-192520 | 7/1992 | Japan . |
| 4-192521 | 7/1992 | Japan . |

*Primary Examiner*—Brian E. Hearn
*Assistant Examiner*—Jonathan D. Baskin
*Attorney, Agent, or Firm*—McAulay Fisher Nissen Goldberg & Kiel

[57] ABSTRACT

Disclosed herein is a coaxial feeding-type plasma processing chamber or an opposed electrode-type plasma processing chamber using an Etch-tunnel comprising: a cylindrical treatment chamber having a gas-introducing mechanism and a gas-exhausting mechanism, and equipped with a heating mechanism at the periphery thereof; an external electrode disposed in close contact to the outer periphery of the cylindrical treatment chamber; and a metal cylindrical member disposed coaxially at a predetermined gap to the inner wall of the cylindrical treatment chamber and a having a plurality of small apertures in the side wall thereof, the gas-introducing mechanism being composed of a gas-introducing pipe having a plurality of gas-blowout means and disposed along the longitudinal direction of the cylindrical treatment chamber, and a gas reservoir connected by way of a pipeline; the gas-exhausting mechanism being composed of a gas-exhausting pipe having a plurality of gas-suction apertures and disposed along the longitudinal direction of the cylindrical treatment chamber and a vacuum means connected by way of a pipeline; and at least the gas-exhausting pipe being disposed to the inside of the metal cylindrical member.

2 Claims, 2 Drawing Sheets

PLASMA PROCESSING CHAMBER

BACKGROUND OF THE INVENTION

The present invention relates to a plasma processing chamber for a plasma processing apparatus and, more in particular, to a plasma processing chamber with an improved utilizing-efficiency for plasma gases and an improved exhausting-efficiency for reaction gases.

The plasma processing chamber (hereinafter referred to as a plasma processing reactor) is as a reactor for use in low temperature plasma etching, low temperature plasma ashing, plasma CVD or the like and it includes various types, depending on the electrode structure, such as a coaxial feeding-type plasma processing reactor (cylindrical coaxial plasma processing reactor) and an opposed electrode-type plasma processing reactor using an Etch-tunnel.

The coaxial feeding-type plasma processing reactor is mainly composed of a cylindrical treatment chamber having a gas-introducing pipe and a gas-exhausting pipe connected to a vacuum system, an external electrode disposed in close contact with the outer periphery of the cylindrical treatment chamber and a cylindrical inner electrode disposed coaxially to the inside of the cylindrical treatment chamber at a predetermined gap therefrom and having a plurality of small apertures in the side wall thereof.

The opposed electrode-type plasma processing reactor using the Etch-tunnel has a structure in which a metal cylindrical member in the plasma processing reactor is not used as an inner electrode but used as an Etch-tunnel, and the electrodes are opposingly disposed in close contact with the outer periphery of the cylindrical treatment chamber.

Then, in any of the plasma processing reactors, wafers to be processed are contained to the inside of the cylindrical inner electrode or the Etch-tunnel and applied with plasma processing.

In the old plasma processing reactor, since the gas-introducing pipe and the gas-exhausting pipe are disposed externally to the cylindrical treatment chamber, such plasma processing reactor has the following drawbacks.

A plasma gas is generated between the external electrode and the cylindrical inner electrode in the coaxial feeding-type plasma processing reactor, or generated between external electrodes in the opposed electrode-type plasma processing reactor using the Etch-tunnel. Radicals which effectively act in the plasma processing, flow to the inside of the cylindrical inner electrode or Etch-tunnel, thereby contributing to the plasma processing. In this instance, since the flowing resistance upon passage through the cylindrical inner electrode or Etch-tunnel is not negligible, there is a drawback that a considerable amount of a plasma gas is exhausted directly to the gas-exhausting pipe connected with the vacuum system and can not be utilized effectively.

Further, the reaction exhaust gases generated upon plasma processing are removed by vacuum-sucking from the cylindrical inner electrode or Etch-tunnel by the gas-exhausting pipe. In this instance, since the flowing resistance upon passage through the cylindrical inner electrode or Etch-tunnel is not negligible, there is a drawback that the gas can not be exhausted efficiently.

An object of the present invention is to provide a plasma processing reactor with an improved utilizing-efficiency for plasma gases and an improved exhausting-efficiency for reaction exhaust gases.

As a result of an earnest study of the present inventors et al, it has been found that in a plasma processing reactor comprising: a cylindrical treatment chamber having a gas-introducing mechanism and a gas-exhausting mechanism and equipped with a heating mechanism at the periphery thereof; an external electrode disposed in close contact with the outer periphery of the cylindrical treatment chamber; and a metal cylindrical member disposed coaxially at a predetermined gap to the inner wall of the cylindrical treatment chamber and having a plurality of small apertures formed in the side wall thereof, the gas-introducing mechanism being composed of a gas-introducing pipe having a plurality of gas-blowout means and disposed along the longitudinal direction of the cylindrical treatment chamber and a gas reservoir connected by way of a pipeline, and the gas-exhausting mechanism being composed of a gas-exhausting pipe having a plurality of gas-suction means and disposed along the longitudinal direction of the cylindrical treatment chamber and a vacuum means connected by way of a pipeline, by disposing at least the gas-exhausting pipe to the inside of the metal cylindrical member, the utilization efficiency of the plasma gas and the exhaustion efficiency of the reaction exhaust gas can be improved in case carrying out the plasma processing in the said plasma processing reactor. The present invention has been accomplished based on the above mentioned finding.

SUMMARY OF THE INVENTION

In an aspect of the present invention, there is provided a coaxial feeding-type plasma processing chamber or an opposed electrode-type plasma processing chamber using an Etch-tunnel comprising: a cylindrical treatment chamber having a gas-introducing mechanism and a gas-exhausting mechanism, and equipped with a heating mechanism at the periphery thereof; an external electrode disposed in close contact to the outer periphery of the cylindrical treatment chamber; and a metal cylindrical member disposed coaxially at a predetermined gap to the inner wall of the cylindrical treatment chamber and a having a plurality of small apertures in the side wall thereof, the gas-introducing mechanism being composed of a gas-introducing pipe having a plurality of gas blowout means and disposed along the longitudinal direction of the cylindrical treatment chamber, and a gas reservoir connected by way of a pipeline; the gas-exhausting mechanism being composed of a gas-exhausting pipe having a plurality of gas-suction means and disposed along the longitudinal direction of the cylindrical treatment chamber and a vacuum means connected by way of a pipeline; and at least the gas-exhausting pipe being disposed to the inside of the metal cylindrical member.

DETAILED DESCRIPTION OF THE INVENTION

Figure 1:
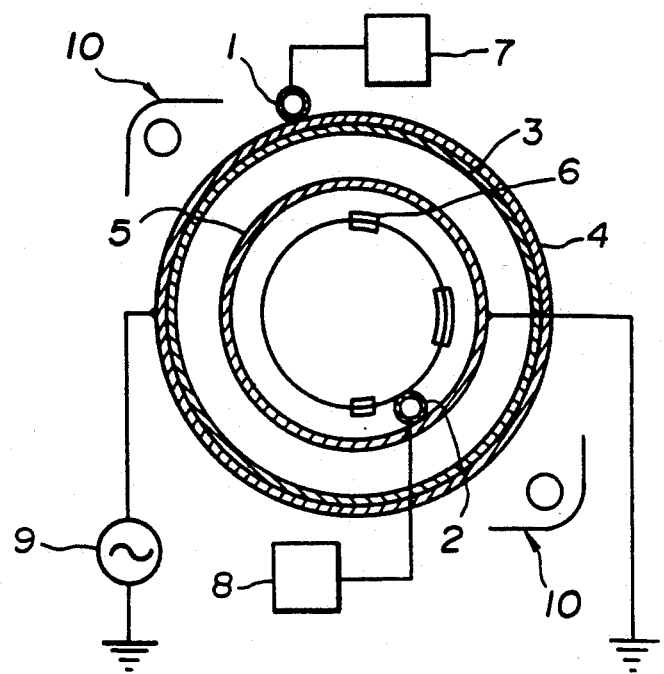
FIG. 1 is an explanatory cross sectional view of a plasma processing reactor according to the present invention.

FIG. 1 is an explanatory cross sectional view of a coaxial feeding-type plasma processing reactor according to the present invention.

The plasma processing reactor mainly comprises cylindrical treatment chamber 3 having a gas-introducing pipe 1 disposed on the outer periphery of an external electrode 4 and a gas-exhausting pipe 2 connected with a vacuum system 8 and disposed between a cylindrical inner electrode 5 and a wafer-holder 6, the external electrode 4 being disposed in close contact with the outer periphery of the cylindrical treatment chamber 3 and the cylindrical inner electrode 5 being disposed coaxially to the inside of the cylindrical treatment chamber 3 at a predetermined gap therefrom and having a plurality of small apertures formed in the side wall thereof.

In the drawing, are shown the wafer-holder 6, a gas reservoir 7 and a high frequency power source 9. The reactor also has a heating mechanism 10 composed of a heater and a reflector.

The cylindrical treatment chamber 3 usually comprises quartz glass. The external electrode 4 is disposed in close contact at the periphery of the cylindrical treatment chamber 3, and the external electrode is connected to the high frequency power source 9.

The cylindrical inner electrode 5 is disposed coaxially to the inside of the cylindrical treatment chamber 3 at a predetermined gap therefrom. The cylindrical inner electrode 5 is made of a metal such as aluminum or alumite and has a plurality of smaller apertures disposed in the side wall. Each of the small apertures has a diameter usually of 0.5 to 10 mm and is disposed at a 0.5–20 mm pitch. Then, the cylindrical inner electrode 5 is usually grounded to the earth.

The gas-introducing pipe 1 is externally equipped to the cylindrical treatment chamber 3 or the external electrode 4. A plurality of gas-blowout apertures (not illustrated) are disposed along the longitudinal direction of the gas-introducing pipe 1 and a plurality of apertures (not illustrated) are disposed on the cylindrical treatment chamber 3 or the external electrode 4 and the cylindrical treatment chamber 3 so as to correspond with the gas-blowout apertures of the gas-introducing pipe 1. A plasma forming gas in the gas reservoir 7 is introduced by way of a pipeline from the gas-blowout apertures of the gas-introducing pipe into the cylindrical treatment chamber 3 through the apertures of the cylindrical treatment chamber 3 or the external electrode 4 and the cylindrical treatment chamber 3.

The gas-exhausting pipe 2 is disposed to the inside of the cylindrical inner electrode 5 A plurality of gas-suction apertures (not illustrated) are disposed to the gas-exhausting pipe 2, and a reaction exhaustion gas in the cylindrical treatment chamber 3 is exhausted by way of a pipeline from the gas-suction apertures under the driving of the vacuum means 8.

The wafer-holder 6 is usually made of quartz, and can be constituted of a plurality of quartz rods each having recessed grooves secured by an appropriate number of quartz rings. Wafers to be processed are placed in the wafer-holder 6 and applied with plasma processing being contained to the inside of the cylindrical inner electrode 5.

A plasma gas is generated between the external electrode 4 and the cylindrical inner electrode 5 and, more specifically, in the entire space between the inner wall of the cylindrical treatment chamber 3 and the cylindrical inner electrode 5. The generated plasma gas is sucked under the sucking effect of the gas exhausting pipe 2 toward the inside of the cylindrical inner electrode 5. In this case, since the cylindrical inner electrode 5 is grounded to the earth and kept at the ground potential, ions, etc. in the plasma gas are captured on the cylindrical inner electrode 5, and radicals which act effectively for the plasma processing can be taken in efficiently to the inside of the cylindrical inner electrode 5.

In the plasma processing reactor described above, the gas-introducing pipe 1 is disposed externally to the cylindrical treatment chamber 3 or the external electrode 4.

The gas-introducing pipe 1 may also be disposed to the inside of the cylindrical treatment chamber 3.

Figure 2:
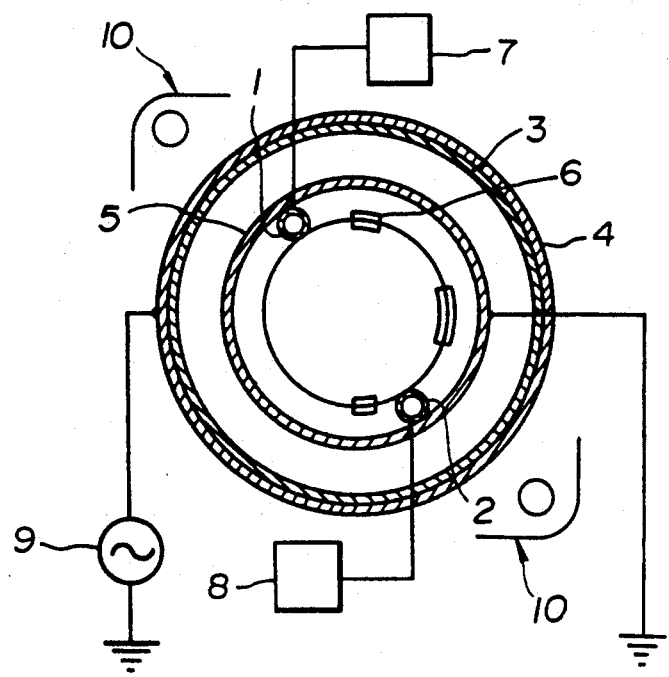
FIG. 2 is an explanatory cross sectional view of a plasma processing reactor of another embodiment according to the present invention.

FIG. 2 is an explanatory cross sectional view of another embodiment of the plasma processing reactor of the present invention, in which a gas-introducing pipe 1 is disposed to the inside of the cylindrical inner electrode 5.

In the plasma processing reactor shown in FIG. 2, the plasma forming gas is introduced from the gas-introducing pipe 1 to the inside of the cylindrical inner electrode 5 and a considerable amount of the gas directly diffuses over the entire space between the inner wall of the cylindrical treatment chamber 3 and the outer wall of the cylindrical inner electrode 5 to form a plasma gas. Accordingly, the effect obtained by disposing the gas-exhausting pipe 2 to the inside of the cylindrical inner electrode 5 is provided relative to such a plasma gas in the same manner as the plasma processing reactor shown in FIG. 1 and radicals in the plasma can be taken in efficiently to the inside of the cylindrical inner electrode 5. Further, it is preferred that the gas-blowout apertures are diposed outwardly along the longitudinal direction of the gas-introducing pipe 1 in case of seeing from the wafer-holder 6 (in other words, in case where the gas-blowout apertures are formed at an opposite side of the gas-introducing pipe 1 against the wafer-holder 6), whereby enough diffusion of the plasma forming gas is generated.

Also, it is preferred that a gas-exhausting pipe 2 in which the horizontal section thereof is a circular arc and the gas-suction apertures are formed at inside surface of the circular-arc of the gas-exhausting pipe 2, is disposed in close vicinity to the outer periphery of the wafer-holder 6.

In a case of disposing the gas-introducing pipe 1 to the inside of the cylindrical treatment chamber 3, if it is disposed, particularly, to the inside of the cylindrical inner electrode 5 as shown in FIG. 2, an effect capable of moderating corrosion of the gas-introducing pipe 1 can be attained as compared with the case of disposing the gas-introducing pipe between the inner wall of the cylindrical treatment chamber 3 and the outer wall of the cylindrical inner electrode 5. Such an effect is remarkable in a case of an etching treatment using a highly corrosive plasma gas.

The plasma processing reactor according to the present invention includes an opposed electrode-type plasma processing reactor using an Etch tunnel, in addition to the coaxial feeding-type plasma processing reactor shown in FIGS. 1 and 2.

Figure 3:
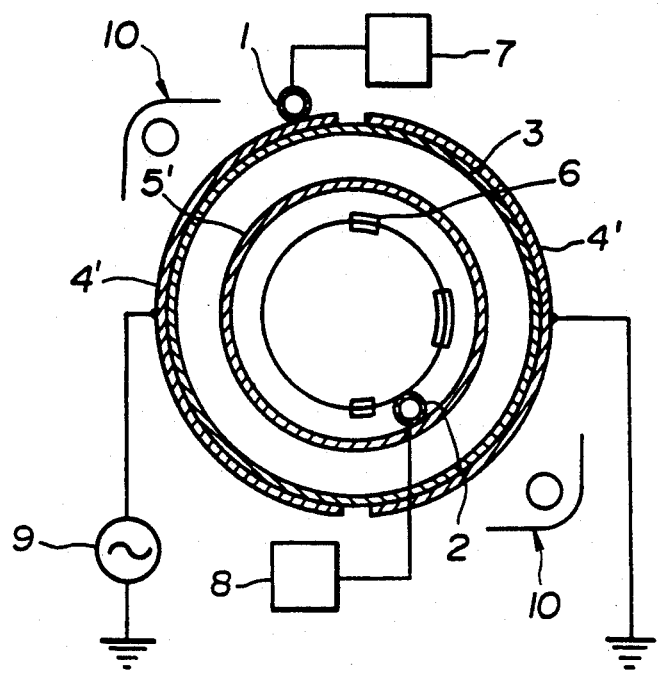
FIG. 3 is an explanatory cross-sectional view of an opposed electrode type plasma processing chamber using an Etch-tunnel according to the present invention.
Figure 4:
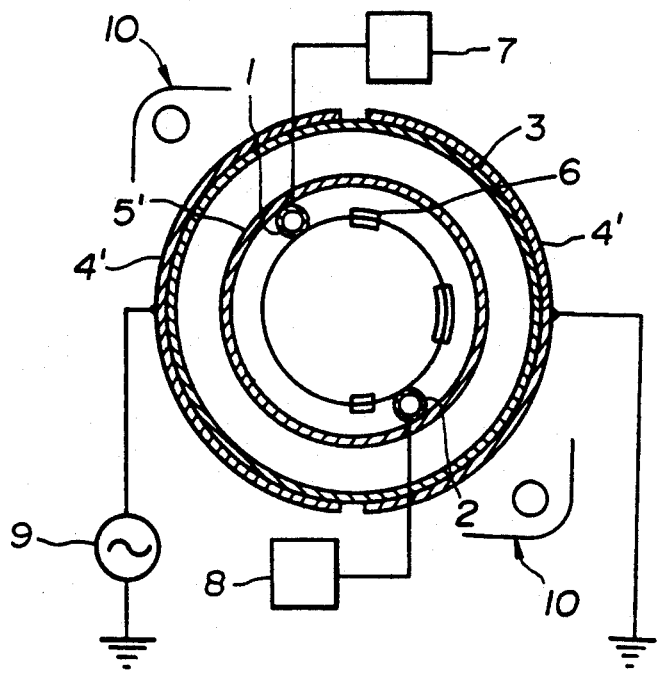
FIG. 4 is an explanatory cross-sectional view of an opposed electrode type plasma processing chamber using an Etch-tunnel of another embodiment according to the present invention.

The opposed electrode-type plasma processing reactor using the Etch-tunnel according to the present invention is constituted as shown in FIGS. 3 and 4.

In the plasma processing reactor shown in FIGS. 3 and 4 the cylindrical inner electrode 5 is not used as the electrode and, accordingly, not grounded to the earth but used as an Etch-tunnel 5', and opposing electrodes 4' are disposed in close contact with the outer periphery of the cylindrical treatment chamber 3.

Also in the plasma processing reactor described above, the effect obtained in disposing the gas-exhausting pipe 2 to the inside of the cylindrical inner electrode 5 is provided in the same manner as the plasma processing reactor shown in FIGS. 1 and 2, so that radicals in the plasma gas can effectively be taken in to the inside of the Etch-tunnel 5', and the reaction exhaustion gas can be removed efficiently.

That is, the gas-exhausting pipe disposed at a position to the inside of the metal cylindrical member constituting the inner electrode or the Etch-tunnel takes in the radicals in the plasma gas to the inside of the cylindrical inner electrode or Etch-tunnel by the sucking effect. At the same time, the reaction exhaustion gases generated at the inside of the inner electrode or Etch-tunnel are exhausted directly Further, although the plasma processing reactor in the embodiments described above is constituted as a vertical structure, it may be constituted as a lateral type in the present invention by using a wafer-holder of an appropriate structure.

The plasma processing reactor of the present invention is used by the same operation as in the existent plasma processing reactor. The degree of vacuum in the cylindrical treatment chamber 3 is usually within a range of 0.1 to 10 Torr. As the plasma forming gas, there may be used depending on the purpose of processing, for example, oxygen, nitrogen, hydrogen, argon, ammonia or water in the case of ashing, and fluorine, oxygen, or ozone is used in the case of etching.

By the plasma processing reactor according to the present invention described above, the efficiency of utilizing the plasma gas and the efficiency of exhausting the reaction exhaust gases can be improved by a simple constitution of disposing the gas-exhausting pipe at a specific position and, accordingly, the present invention is a greater industrial value.

What is claimed is:

1. A coaxial feeding-type plasma processing chamber or an opposed electrode-type plasma processing chamber using an Etch-tunnel comprising: a cylindrical treatment chamber having a gas-introducing mechanism and a gas-exhausting mechanism, and equipped with a heating mechanism at the periphery thereof;

an external electrode disposed in close contact to the outer periphery of the cylindrical treatment chamber; and a metal cylindrical member disposed coaxially at a predetermined gap to the inner wall of the cylindrical treatment chamber and having a plurality of small apertures in the side wall thereof, the gas-introducing mechanism being composed of a gas-introducing pipe having a plurality of gas-blowout means and disposed along the longitudinal direction of the cylindrical treatment chamber, and a gas reservoir connected by way of a pipeline; the gas-exhausting mechanism being composed of a gas-exhausting pipe having a plurality of gas-suction apertures and disposed along the longitudinal direction of the cylindrical treatment chamber and a vacuum means connected by way of a pipeline; and at least the gas-exhausting pipe being disposed to the inside of the metal cylindrical member.

2. A coaxial feeding-type plasma processing chamber or an opposed electrode-type plasma processing chamber using an Etch-tunnel according to claim 1, wherein the gas-introducing pipe is disposed at the inside of a metal cylindrical member.

* * * * *